United States Patent [19]

Deckman et al.

[11] Patent Number: 4,512,848
[45] Date of Patent: Apr. 23, 1985

[54] PROCEDURE FOR FABRICATION OF MICROSTRUCTURES OVER LARGE AREAS USING PHYSICAL REPLICATION

[75] Inventors: Harry W. Deckman, Clinton; John H. Dunsmuir, Annandale, both of N.J.

[73] Assignee: Exxon Research and Engineering Co., Florham Park, N.J.

[21] Appl. No.: 577,174

[22] Filed: Feb. 6, 1984

[51] Int. Cl.³ .................... H01L 21/306; B44C 1/22; C03C 15/00; C03C 25/06
[52] U.S. Cl. .................................. 156/630; 156/633; 156/643; 156/646; 156/659.1; 156/657; 156/660; 156/667; 204/192 E
[58] Field of Search ............ 156/630, 633, 631, 659.1, 156/660, 661.1, 904, 643, 646, 667, 653, 657, 662; 252/79.1; 204/192 E

[56] References Cited
U.S. PATENT DOCUMENTS 3,052,581  9/1962  Gutknecht ........................ 156/660
3,290,191  12/1966  Davis .............................. 156/660

Primary Examiner—William A. Powell
Attorney, Agent, or Firm—Ronald D. Hantman

[57] ABSTRACT

The present invention is an improved replication process which copies a master pattern onto an intermediate transfer mask which is then used to form a lithographic mask on the surface of a substrate. A pattern derived from the original master pattern is then produced in the substrate by an etching process.

14 Claims, 3 Drawing Figures

A

B

C

D

FIG. 1
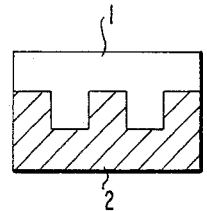
A
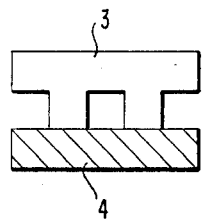
B
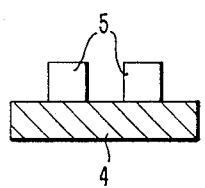
C
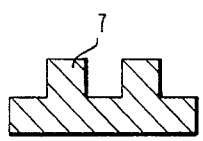
D

FIG. 3
A
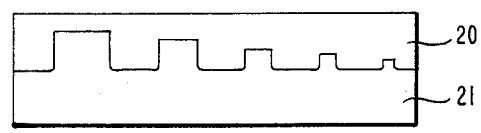
B
C
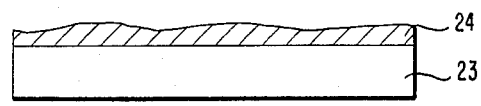
D
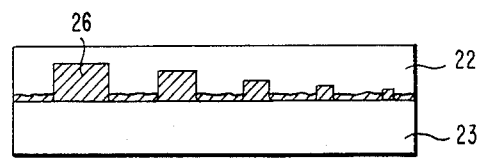
E
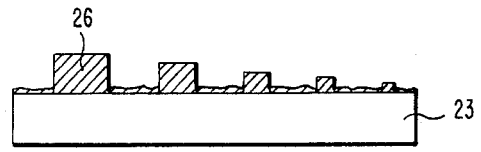
F
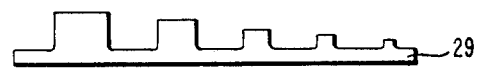

PROCEDURE FOR FABRICATION OF MICROSTRUCTURES OVER LARGE AREAS USING PHYSICAL REPLICATION

BACKGROUND OF THE INVENTION

The present invention relates to a process for the replication of existing surface textures into materials that cannot conveniently be embossed, deformed or optically patterned.

Surface textures have been extensively used to fabricate a variety of optical elements such as diffraction gratings, holograms and thin film elements for integrated optics. Other applications for surface textures occur in the construction of optically enhanced solar cells. Optically enhanced solar cells contain a periodic or random surface texture which increases the efficiency for absorption of light within the cell, see e.g., H. Deckman, H. Witzke, C. Wronski, E. Yablonovitch, Appl. Phys. Lett. 42. 968 (1983) and H. W. Deckman, C. R. Wronski and H. Witzke, J. Vac. Sci. Technol. A1, 578 (1983).

Replication techniques used to produce textured surfaces are of three principal types, optical, physical and metallic coating.

Many electronic devices and optical elements are fabricated of materials of carefully selected electronic and optical properties. These materials, in many cases, cannot be embossed or deformed to form a desired surface texture. It is therefore necessary to define a lithographic mask on the surface of each device or element which will protect certain portions of the surface from attack by etchants. This mask, when removed after etching, will reveal the texture in the surface of the device or optical element which was previously defined in the mask.

Optical replication techniques usually define a lithographic mask on the surface of the device or optical element by coating the part with a thin layer of polymer that is sensitive to U.V. light or to other ionizing radiation. The polymer is then exposed by an optical system which contains the desired pattern. Depending on the exposure, portions of the polymer can then be dissolved by solvents leaving a patterned lithographic mask on the surface which is a replica of the pattern contained in the optical system. The practical limitations of this process are reached when texture sizes lie below 0.5 $\mu$m or when the surface of the device is curved. Furthermore, the pattern must be photolithographically defined on each individual device.

Physical replication techniques which have been previously used involve plastic deformation of some part of the substrate material in a molding, embossing, solution casting or polymerization process. Physical replication processes have been extensively used to copy diffraction gratings and are described by White et al., U.S. Pat. No. 2,464,739; G. D. Dew and L. A. Sayre, Proc. Ray. Soc. A 207, 278 (1951); G. D. Dew, J. Sci. Instrum. 33, 348 (1956); and I. D. Torbin and A. M. Nizihin, Optical Technology 40, 192 (1973). These processes involve contacting a master pattern with an organic liquid material which solidifies to produce a copy of the original surface. The solidification occurs because of cooling, solvent loss, or polymer formation; in molding, solution-casting or polymerization processes, respectively. In all cases the solidified material becomes part of a substrate with a copy of the original pattern on its surface. As such, the substrate surface is created during pattern transfer by plastic deformation of a liquid like material in a physical replication process. Optical elements such as fly's eye lenses, diffraction gratings, spherical and aspherical mirrors and holograms have been fabricated using physical replication techniques described in SPIE Vol. 115, *Advances in Replicated and Plastic Optics,* (1977) and by T. D. Torbin and A. M. Nizihin, Optical Technology 40, 192 (1973). In all of these techniques patterns are transferred into an organic polymerizing media by some type of physical replication process. Physical replication techniques are extensively used to copy audio and video disks from metallic master patterns into polymerizing materials and are described in RCA Review 39 (1978). All physical replication methods rely on plastic deformation of a material which is eventually incorporated into the final substrate.

Metallic replicas are formed by metallic plating of a master pattern to a thickness such that the deposit can be peeled off the master pattern. The metallic replica is a negative of the original pattern and is usually laminated onto the surface of a pre-existing substrate. Replicas can be formed without using plastic deformation by metallic coating techniques which are described in RCA Review 39 (1978). Using either physical replication or metallic plating methods, the texture on the master is directly reproduced and cannot be substantially altered in a predetermined manner during replication.

The present invention discloses a method for replicating microstructured patterns into pre-existing organic or inorganic substrates using an intermediate lithographic transfer mask. The invention allows patterns to be transferred from masters into substrates which could not be patterned with previously available techniques. Previous replication techniques copy patterns using processes which require either deformation of a substrate material or metallic plating methods or optical patterning of each individual optically flat substrate. The present invention does not require the substrate material to be flat or to be plastically deformed or to be metallic for the transfer and hence can be easily used on substrate materials such as glass, alumina and other refractory oxides, and semiconductors.

The present invention provides an improved process for replication which can be used with pre-existing organic and inorganic substrates. The method is not limited by choice of substrate into which the pattern is transferred as is the case with physical replication and plating methods.

The present invention also provides an improved process for replication in which the shape of the surface texture can be altered in a predetermined manner during the replication process. The flexibility of altering the shape of the surface texture comes from use of an intermediate lithographic mask to transfer the pattern from master to substrate.

The present invention also provides an improved process for replication in which a texture on a flat master can be transferred to a curved substrate. Alternatively a texture may be transferred from a curved master to a flat substrate or from a curved master to a curved substrate. This transfer between flat and curved surfaces is made possible by the flexibility of the intermediate lithographic transfer mask.

The present invention also provides an improved process for replication which can rapidly copy large as well as small area masters.

The present invention also provides an improved process for replication capable of producing a large number of copies from a single master pattern.

The present invention also provides an improved process for replication which does not require use of an optical system to transfer the pattern from master to replica.

SUMMARY OF THE INVENTION

The present invention is a process for replication of microstructures from a master. The invention includes the steps of:

coating said master with a layer of film forming polymer material so as to form a negative replica of said microstructures of said master onto one surface of said polymer material, such that said polymer becomes solidified; separating said solidified layer of polymer material from said master; placing said solidified layer of polymer material onto a surface of a substrate so as to form a lithographic mask; and transferring a pattern derived from said lithographic mask to said substrate by etching.

BRIEF DESCRIPTION OF THE DRAWINGS

FIG. 1 shows a schematic diagram illustrating an embodiment of the present invention which produces on a substrate a negative replica derived from a master pattern.

FIG. 3 shows a schematic diagram illustrating an embodiment of the present invention which produces on a substrate a positive replica derived from a master pattern.

PREFERRED EMBODIMENT

Figure 2:
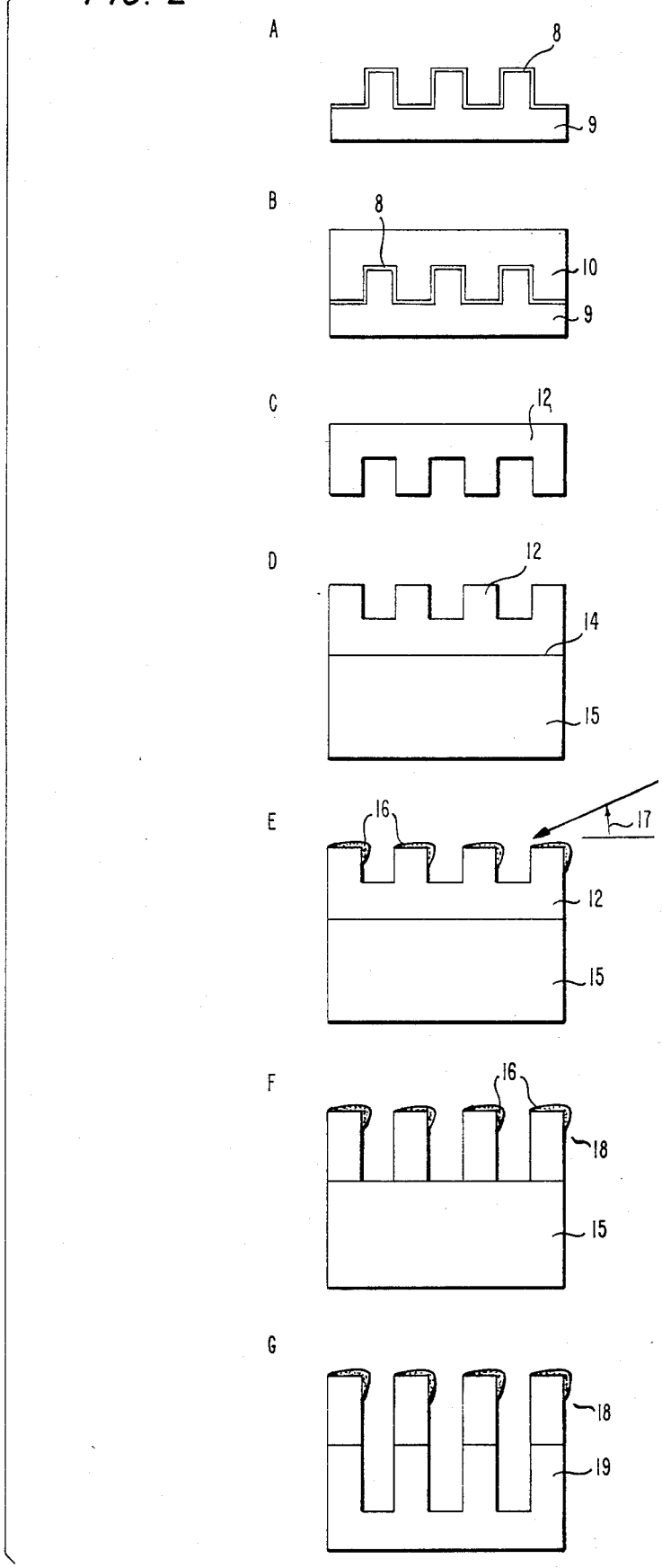
FIG. 2 shows a schematic diagram illustrating an embodiment of the present invention which produces on a substrate a contrast enhanced negative replica derived from a master pattern.

The improved replication process can be briefly described as a process which copies a master pattern onto an intermediate transfer mask which is then used to form a lithographic mask on the surface of a substrate. Either a positive or negative tone pattern derived from the original master pattern is produced in the substrate by using the lithographic mask in an etching process. A negative replica is produced in the substrate by using the intermediate transfer mask directly as a lithographic mask. A positive replica is produced in the substrate by pressing the intermediate transfer mask into a thin layer of polymeric cement coated on the substrate. This is followed by removal of the intermediate transfer mask from the solidified polymeric cement leaving a lithographic mask which is a positive replica of the master.

To create a negative replica, the intermediate lithographic transfer mask is formed by coating the master with a layer of film forming polymer which is sufficiently thin to act as a lithographic mask in a final etching step. One side of the polymer film replicates the surface texture while the opposite side must be sufficiently smooth so as not to interfere with lithographic properties when the film is used as an etching mask. To act as a lithographic mask, the polymer film must be separated from the master and placed in intimate contact with the smooth surface of the new material to be patterned which is called the substrate. Separation of the polymer film from the master may be accomplished using a variety of techniques either singly or in combination: (1) physically peeling the polymer film from the master; (2) use of liquid surface tension to float the polymer film off the master; (3) or interposing a release agent between the polymer film and master. Transfer of the polymer film onto the substrate to be patterned can also be accomplished with a variety of techniques: (1) flotation of the film with a fluid over the substrate followed by a drying step (the fluid is removed by careful evaporation such that no bubbles are formed between the intermediate mask and the substrate); (2) use of adhesive layers to cement the intermediate mask in intimate contact with the substrate. When cements are used it is necessary that the flat side of the intermediate mask is cemented to the substrate; (3) electrostatic transfer of the intermediate mask to the substrate. By inducing static charges of opposite signs between the substrate and the intermediate mask, the mask can be drawn into intimate contact with the substrate. In all cases which form negative replicas the polymer film is in intimate contact with the substrate; however, in some cases it is desirable to have the textured surface of the polymer film contact the substrate while in other cases the smoother side of the polymer film is placed in intimate contact with the substrate.

To create a positive replica, the intermediate transfer mask is formed by coating the master with a layer of film forming polymer so that the polymer surface in contact with the master forms a negative replica of the master. The solidified polymer is then removed from the master by peeling, surface tension, or release agents. The solidified polymer film need not be thin since it is used only as an intermediate transfer mask. The lithographic mask is formed on the surface of the substrate by pressing the surface of the intermediate transfer mask into a layer of polymeric cement on the substrate surface. The flexible nature of the intermediate transfer mask allows most of the excess cement to be squeezed out from between the intermediate transfer mask and the substrate. After the polymeric cement is solidified it should not be dissolvable in a solvent for the intermediate transfer mask. The transfer mask can then be dissolved away leaving the cement to act as a lithographic mask in intimate contact with the substrate.

In either case (positive or negative replication) patterns are transferred by using the polymer film as a lithographic mask for etching processes. Wet chemical etching processes can be used; however, dry etching process such as plasma or ion beam etching are preferred. The shape of the pattern evolved in the substrate depends upon the etching rate of the mask relative to the substrate i.e. etch contrast. The shape of the surface texture formed as a result of etching can be altered from that of the master by controlling the chemistry of the etch process or by changing the physical processes of the etch such as angle of incidence or incident energy of the chemical species used to ion beam or plasma etch. Additionally, surface textures can be altered in a controlled manner by coating part of the mask with a metallic layer prior to etching such that the etch resistance of the coated part of the mask is substantially increased by the coating. Coating part of the mask may be accomplished by shadow evaporation or similar coating techniques. This results in contrast enhancement.

Requirements for the intermediate mask are different for positive and negative replication of patterns into the final substrate. In all cases, the intermediate mask is formed from polymeric materials such as collodion, poly(methyl methacrylate), poly(vinyl pyrrolidone), methyl celluose, epoxy, silicone rubber, polystyrene . . .

For negative replication, materials chosen to form the intermediate mask must be coated onto the master in a manner such that the film formed will act directly as a lithographic mask. To act as a lithographic mask, one side of the film should replicate the surface texture of the master, while the opposite side should be sufficiently smooth so that a pattern can be transferred in a subsequent etching step. The thickness of the intermediate mask should be greater than the depth of the surface texture on the master; however, it must be thin enough to act as a lithographic mask. To produce a negative replica of a grating with 5,000 Å grove depth, the intermediate mask should be approximately 1 $\mu$m thick. The locally averaged film thickness should be essentially uniform across the master. Coating methods which can be used to apply such thin polymer films to the master include spin coating, roll coating, dip coating, and spray coating. For positive replication, the intermediate mask does not have to act as a lithographic mask and can be quite thick. Positive replicas in a final substrate can be produced from masks of 0.5 $\mu$m–10 cm thickness. The only requirement is that one side of the intermediate mask substantially replicates the pattern on the master. For positive replication, of a grating with 5,000 Å grove depth, an intermediate mask formed from 0.5 mm thick collodion film can be used.

The separation technique chosen to remove the intermediate mask from the master depends primarily on the properties of the polymer film used. Stress generated by shrinkage of polymer films coated from solution may create an adhesion failure allowing some polymers to be peeled directly from the master pattern. As a general rule, thicker polymer films are easier to peel from the master than thin films. For example, a 5 $\mu$m poly(methyl methacrylate) film can readily be peeled from a silicon master, while a 0.5 $\mu$m thick film is difficult to remove, and folds on itself after removal. Alternatively, it is often possible to remove the polymer film by using liquid surface tension to float the film off the master pattern. For example, a 0.5 $\mu$m thick poly(methyl methacrylate) film can be removed from a silicon master by flotation on water. Removal of the film in water eliminates folding of the unsupported film on itself. To assist in the removal of a polymer film from the master surface, a suitably chosen release agent can be interposed between the polymer film and master. The release agent may be either an organic or inorganic film with thickness signficantly less than that of the texture depth on the master. It should be weakly bonded to the substrate or should be soluble in a liquid that is not a solvent for the master pattern and intermediate mask. For example, a $\sim$100 Å layer of poly(vinyl pyrrolidone) will act as a release layer for a 0.5 $\mu$m thick poly(methyl methacrylate) mask. The poly(vinyl pyrrolidone) layer is soluble in water while poly(methyl methacrylate) and silicon are nonsoluble.

Choice of the method used to separate the intermediate mask from the master is often a matter of convenience. General requirements for separation of the intermediate mask from the master are that (1) the process should not distort the pattern on the intermediate mask and (2) the process should not degrade the master pattern. For negative replication the transfer of the intermediate mask to the substrate must be such that the intermediate transfer mask is made useable as a lithographic mask. This requires that the intermediate transfer mask be in intimate contact with the substrate over the entire surface and firmly held in position so that it does not become detached from the substrate or move during etching. Small bubbles of trapped gas cannot be allowed between the substrate and the intermediate transfer mask. This requirement can be met by a variety of techniques. By floating the intermediate mask above the substrate on a thin layer of volatile liquid that does not attack either the intermediate transfer mask or the substrate, the mask may be placed accurately and evenly on the substrate surface. The liquid acts as a lubricant during this step. After the mask is positioned on the substrate, the liquid is carefully evaporated so that no bubbles form between the mask and the substrate. The forces generated by drying press the film into intimate contact with the substrate. This technique may be used with the textured side of the mask either toward or away from the substrate. The intimate contact usually renders the mask immobile on the substrate. If the mask peels from the substrate after the above process, a cement may be used to affix the mask to the substrate. Cements are of two types. The first type of cement is the addition of a small amount of material to the volatile liquid described previously to improve the adhesion of the mask to the substrate after drying. Small amounts of poly vinyl pyrrolidone in water have been used with this method. This method is used where the smooth side of the mask is toward the substrate surface. A second type of cement may be used to implement a positive replication scheme. The cement is a polymerizing media or concentrated polymer in solution. The cement is placed between the substrate and the mask with the mask texture toward the substrate and the excess cement is then pressed out from between the two. The cement should be insoluble in a solvent which is used to dissolve the intermediate mask. The cement then forms a positive lithographic mask on the surface of the substrate. Following this, the intermediate mask is removed by disolution.

EXAMPLE 1

Referring to FIG. 1 shows a schematic representation of negative replication of a random array of 0.5 $\mu$m diameter 0.7 $\mu$m high posts originally produced on a silicon master by natural lithography (U.S. Pat. No. 4,407,695; H. W. Deckman and J. H. Dunsmuir). A negative replica of the posts in the Si master is created in a new silicon substrate using collodion, a polymer, to form an intermediate lithographic mask. The production of the negative replica involves the following steps:

(A) The collodion 1 is cast from solution onto the master 2 using a spin coating technique. In this step, the entire surface of the master should be coated with a layer of polymer only sufficiently thick so that the polymer bottom surface conforms to the master and the top surface is essentially smooth. In this example the collodion was spun on at 3000 rpm from solution to a thickness of $\sim$1 $\mu$m.

(B) The collodion film is separated from the master. The poor adhesion of collodion to the master greatly simplifies this step and makes unnecessary the use of release agents since the collodion film peels readily from the master. The surface of this collodion film which was in contact with the master contains a negative copy of the master. This film will be called the intermediate mask in this and the following examples. The surface of the intermediate mask 3 which was in contact with the master is placed in intimate contact with the new silicon substrate to be patterned 4. This allows faithful reproduction of small details of the master in the new substrate. Other examples will show use of the intermediate mask with the flat surface in contact with the new substrate to be patterned. Intimate contact between the intermediate and the substrate is obtained by floating the intermediate mask above the substrate surface with a thin layer of a volatile liquid which is not a solvent for either substrate or intermediate mask. The liquid is then evaporated under conditions which do not form gas bubbles between the intermediate mask and substrate. In this example water is used and is evaporated at approximately 60° C. under ambient atmospheric conditions;

(C) The substrate with intermediate is then etched by either plasma or ion beam etching to transfer the pattern from the intermediate mask to the substrate. In this example, argon ion beam milling was used to first erode the flat surface of the intermediate mask. After the flat portion has been eroded away, only the textured portion of the intermediate mask 5 is left in contact with the new substrate 4. This portion of the intermediate acts as a lithographic mask while the substrate is eroded by the ion beam;

(D) After the new substrate has been etched, the residue of the intermediate mask is stripped away leaving a negative replica of the master 7. A repeat of the process using the negative replica as a secondary master will yield a positive replica of the master.

EXAMPLE 2

Referring to FIG. 2 shows a schematic representation of the production of a contrast enhanced negative replica from an intermediate mask requiring a release agent. In this example, the master is a holographic grating replica produced by conventional techniques having a surface relief of ~700 Å and 3600 lines per millimeter. Production of enhanced replicas in silicon, quartz and saphire consists of the following steps.

(A) An ultra thin layer of poly vinyl pyrrolidone 8 (PVP) is cast from 0.25 wt% solution in isopropanol onto the master (holographic grating) surface 9 using a spin coating technique at 8000 rpm. The thickness of the PVP layer is approximately 100 Å or less.

(B) The intermediate mask 10 of poly methyl methacrylate (PMMA) is cast from 5 wt% solution in xylene onto the surface of the PVP coated master 9 using a spin coating technique at 3000 rpm. The PVP release agent is not soluble in xylene. The thickness of the PMMA intermediate mask can be varied depending on the degree of contrast enhancement required and in this example, is approximately 0.5 μm. PMMA is used since it is more compatible with plasma processes and is more dimensionally stable than collodion.

(C) The PMMA intermediate 12 is lifted from the master by dipping in water. The PVP release agent is water soluble and separates the PMMA intermediate mask from the master.

(D) The flat side 14 of the PMMA intermediate mask 12 is placed in intimate contact with the substrate 15 using the water floating technique described in Example 1, step B.

(E) An oxygen etch resistant material, in this example aluminum 16, is shadow evaporated onto the PMMA mask 12. Evaporation angle 17 and thickness of aluminum 16 deposited must be carefully controlled since these will affect final feature size. In this example, 300 Å of aluminum was evaporated at an angle of 10° [MgF$_2$ and CaF$_2$ have also successfully been used].

(F) The shadowed PMMA mask is oxygen plasma etched or oxygen ion milled to form a high aspect lithographic mask 18 on the substrate 15. The 500 ev oxygen ion beam with intensity of 0.3 m A/cm$^2$ selectively etches the polymer mask 18 and does not significantly attack the substrate 15 or the shadow evaporated Al 17.

(G) The substrate is reactively plasma etched or ion milled to produce a high aspect replica 19 the remaining lithographic mask 18 is then stripped away.

If the substrate 19 is made from a Si, SiO$_2$ or Al$_2$O$_3$ a high aspect pattern can be produced by etching with a CF$_4$ or CCl$_4$ reactive ion beam.

EXAMPLE 3

Referring to FIG. 3 shows a schematic representation of the production of a positive replica involving the following steps:

(A) A layer of collodion 20 is applied to the master 21 by casting from solution. The collodion may be a thick layer. In this example a 6 μm thick film was spun from 10 wt.% solution onto a silicon master containing various size posts, the target being 0.5 μm diameter × 0.7 μm high.

(B) The collodion intermediate mask 22 is peeled from the master. The poor adhesion of collodion on silicon greatly simplifies this step.

(C) The substrate 23 is coated with a layer of cement 24. The cement in this example is a low viscosity epoxy.

(D) The intermediate mask 22 is pressed onto the surface cement 24 such that the mask is cemented in contact with the substrate so as to squeeze out as much excess cement as possible. The solidified cement 26 is not dissolvable in a solvent for the intermediate mask 22.

(E) The collodion intermediate mask is dissolved away leaving the patterned epoxy 26 in contact with the substrate 23.

(F) The epoxy is used as a lithographic mask during etching to form a positive replica 29 of the master in the substrate. The cement does not become a permanent part of the new replica 29.

EXAMPLE 4

The method of Example 3 where the cement lithographic mask is contrast enhanced as in Example 2, steps E through G.

What is claimed is:

1. A process for the negative or positive replication of microstructures from a master comprising:
    (a) coating said master with a layer of film forming polymer material so as to form a negative replica of said microstructures of said master onto one surface of said polymer material, such that said polymer becomes solidified, said material being a single polymeric material;
    (b) separating said single solidified layer of polymer material from said master;
    (c) placing said single solidified layer of polymer material onto a surface of a substrate so as to form a lithographic mask; and
    (d) transferring a pattern derived from said lithographic mask to said substrate by etching.

2. The process of claim 1 wherein said placing step comprises:
   (a) coating said substrate with a polymeric cement;
   (b) pressing said solidified polymer onto said cement coated substrate;
   (c) curing said polymeric cement, and
   (d) removing said solidified polymer from said substrate leaving said cured polymer cement on said substrate to form a lithographic mask.

3. The process of claim 1 wherein coating said master step is performed such that said layer of film forming polymer is a thin film and said placing step is performed such that said solidified polymer is in direct contact with said substrate so as to form said lithographic mask.

4. The process of claim 3 wherein the surface of said layer of said solidified polymer away from said surface having said negative replica is substantially smooth and said placing step is performed such that said smooth surface is in contact with said substrate.

5. The process of claim 3 wherein the surface of said layer of said solidified polymer away from said surface having said negative replica is substantially smooth and said placing step is performed such that at least a portion of said surface having said negative replica is in contact with said substrate.

6. The process of claim 1 wherein said placing step is performed such that at least a portion of said surfacing having said negative replica is in contact with said substrate.

7. The process of claim 1 wherein the step of coating is performed by spinning a polymer solution directly onto said master.

8. The process of claim 1 further comprising the step of coating said master with a release agent before the step of coating said master with a layer of film forming polymer material.

9. The process of claim 1 wherein said step of coating said master with a layer of film forming polymer material is performed by solution casting.

10. The process of claim 3 further comprising the steps of (a) interposing a volatile liquid between said solidified polymer and said substrate (b) evaporating said volatile liquid such that said solidified polymer and said substrate are in intimate contact.

11. The process of claim 1 wherein the contrast of said pattern transferred to said substrate is enhanced over said negative replica.

12. The process of claim 11 wherein said contrast enhancement is obtained by depositing onto a portion of said negative replicated surface of said solidified polymer a material having an etch rate less than the etch rate of said solidified polymer.

13. The process of claim 1 wherein said master includes microstructures on a macroscopic curved surface.

14. The process of claim 1 wherein said surface of said substrate on which said mask is placed is curved.

* * * * *